United States Patent
Lee

(10) Patent No.: US 9,124,205 B2
(45) Date of Patent: Sep. 1, 2015

(54) APPARATUS FOR GENERATING MOTOR DRIVING CONTROL SIGNAL

(71) Applicant: SAMSUNG ELECTRO-MECHANICS CO., LTD., Suwon, Gyunggi-do (KR)

(72) Inventor: Soo Woong Lee, Gyunngi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 233 days.

(21) Appl. No.: 13/746,855

(22) Filed: Jan. 22, 2013

(65) Prior Publication Data

US 2014/0117895 A1 May 1, 2014

(30) Foreign Application Priority Data

Oct. 29, 2012 (KR) .................. 10-2012-0120726

(51) Int. Cl.
| | |
|---|---|
| *H02P 6/14* | (2006.01) |
| *H02P 6/18* | (2006.01) |
| *H02P 6/16* | (2006.01) |
| *H03K 17/082* | (2006.01) |
| *H03K 17/16* | (2006.01) |

(52) U.S. Cl.
CPC .............. *H02P 6/182* (2013.01); *H02P 6/165* (2013.01); *H03K 17/0822* (2013.01); *H03K 17/167* (2013.01)

(58) Field of Classification Search
CPC .................... H03K 17/167; H03K 17/0822
USPC ..................... 318/400.26, 685, 686
See application file for complete search history.

(56) References Cited

U.S. PATENT DOCUMENTS

| | | | | |
|---|---|---|---|---|
| 4,973,896 | A | * 11/1990 | Shiga et al. ................... | 322/28 |
| 5,796,227 | A | 8/1998 | Sears et al. | |
| 5,872,703 | A | * 2/1999 | Williams et al. ............... | 363/17 |
| 7,573,287 | B2 | * 8/2009 | Rabenstein et al. ........... | 326/26 |
| 8,412,965 | B2 | * 4/2013 | Hopkins ..................... | 713/300 |

FOREIGN PATENT DOCUMENTS

| | | |
|---|---|---|
| JP | 2005176452 A | 6/2005 |
| JP | 2006166658 A | 6/2006 |
| KR | 10-2000-0050368 A | 8/2000 |

OTHER PUBLICATIONS

Office Action issued on Jan. 7, 2014 in the corresponding Japanese Patent Application No. 2013-007634.

* cited by examiner

*Primary Examiner* — Erick Glass
(74) *Attorney, Agent, or Firm* — NSIP Law

(57) ABSTRACT

There is provided an apparatus for generating a motor driving control signal, the apparatus including: an oscillating unit generating an oscillating signal having a preset duty ratio; a selecting unit including a first switch switching a first path connected between the oscillating unit and an output terminal and a second switch complementarily operated with respect to the first switch and switching a second path connected to the first path in parallel; and a duty adjusting unit installed on the second path between the second switch and the output terminal, adjusting a duty ratio of the oscillating signal according to a rotation speed signal of a motor, and outputting the signal having the adjusted duty ratio as a driving control signal through the output terminal.

15 Claims, 4 Drawing Sheets

APPARATUS FOR GENERATING MOTOR DRIVING CONTROL SIGNAL

CROSS-REFERENCE TO RELATED APPLICATIONS

This application claims the priority of Korean Patent Application No. 10-2012-0120726 filed on Oct. 29, 2012, in the Korean Intellectual Property Office, the disclosure of which is incorporated herein by reference.

BACKGROUND OF THE INVENTION

1. Field of the Invention

The present invention relates to an apparatus for generating a motor driving control signal capable of being applied to a sensorless motor.

2. Description of the Related Art

Generally, during driving a motor, a speed thereof needs to be controlled to a desired motor driving speed, and in order to control the driving of the motor as described above, the speed of the motor is monitored.

As schemes of monitoring the speed of a motor, there exist a sensor scheme using a sensor such as a hall sensor, an optical sensor, or the like, and a back electromotive force (back EMF) scheme of using back EMF generated in a direction opposite to a direction of rotation of the motor when the motor is rotated, in the case in which a sensor is not used.

Meanwhile, one of existing motor driving methods for driving a motor at a constant speed is to provide an external direct current (DC) input signal. In this method, a signal having a duty ratio of 100% is input from the outside to operate the motor at a maximum duty ratio, that is, at a maximum speed.

In general, minimum and maximum rotation speeds of a motor are determined according to a duty ratio. In the above-mentioned method, for example, the motor is operated at a duty ratio of 100%, that is, at a maximum speed during DC input.

In the motor driving scheme according to the related art as described above, a process of controlling the motor is simple; however, since the DC input signal is provided from the outside, an external signal source is required.

In addition, since the motor is controlled to be rotated only at the minimum or maximum speed, a range of rotation speeds of the motor is significantly limited.

Furthermore, in the case of the scheme using back EMF, since back EMF has a magnitude in proportion to a rotation speed of the motor, it may be very low during initial driving of the motor, such that a feedback control may not be appropriately performed.

The following Related Art Document (Patent Document 1), which relates to a sensorless mode conversion apparatus of a brushless direct current (DC) motor, fails to disclose a technical feature of controlling the driving of a motor in a state in which an initial driving period and a period after the initial driving period are separated from each other.

RELATED ART DOCUMENT (Patent Document 1) Korean Patent Laid-Open Publication No. 10-2000-0050368

SUMMARY OF THE INVENTION

An aspect of the present invention provides an apparatus for generating a motor driving control signal capable of being applied to a sensorless motor and ensuring stable initial driving by controlling the driving of a motor in a state in which an initial driving period and a period after the initial driving period are separated from each other.

According to an aspect of the present invention, there is provided an apparatus for generating a motor driving control signal, the apparatus including: an oscillating unit generating an oscillating signal having a preset duty ratio; a selecting unit including a first switch switching a first path connected between the oscillating unit and an output terminal and a second switch complementarily operated with respect to the first switch and switching a second path connected to the first path in parallel; and a duty adjusting unit installed on the second path between the second switch and the output terminal, adjusting a duty ratio of the oscillating signal according to a rotation speed signal of a motor, and outputting the signal having the adjusted duty ratio as a driving control signal through the output terminal.

According to another aspect of the present invention, there is provided an apparatus for generating a motor driving control signal, the apparatus including: an oscillating unit generating an oscillating signal having a preset duty ratio; a selecting unit including a first switch switching a first path connected between the oscillating unit and an output terminal and a second switch complementarily operated with respect to the first switch and switching a second path connected to the first path in parallel; a duty adjusting unit installed on the second path between the second switch and the output terminal, adjusting a duty ratio of the oscillating signal according to a rotation speed signal of a motor, and outputting the signal having the adjusted duty ratio as a driving control signal through the output terminal; and a selection controlling unit generating a first switching signal for controlling the first switch and a second switching signal for switching the second switch.

The first switch may be turned on for a preset initial driving time to connect the first path.

The second switch may be turned off for the initial driving time and be turned on after the initial driving time has elapsed to connect the second path.

The oscillating signal may be a square wave signal having a preset period.

The rotation speed signal of the motor may be a back electromotive force voltage generated during driving the motor.

The duty adjusting unit may include: a first comparing unit comparing a plurality of reference voltages set to have different voltage levels with the rotation speed signal and outputting a digital signal corresponding to a level of the rotation speed signal; a digital to analog converting unit converting the digital signal into an analog voltage; a second comparing unit comparing the analog voltage with a preset duty reference voltage and providing a comparison result signal; and a duty varying circuit unit varying a width of the oscillating signal according to the comparison result signal.

The duty varying circuit unit may decrease the width of the oscillating signal by a preset amount when the comparison result signal has a high level, and may increase the width of the oscillating signal by a preset amount when the comparison result signal has a low level.

The selection controlling unit may include: a signal generator generating the first switching signal having a high level for a preset initial driving time according to a power supply voltage supplied during power on; and an inverter inverting the first switching signal to generate the second switching signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
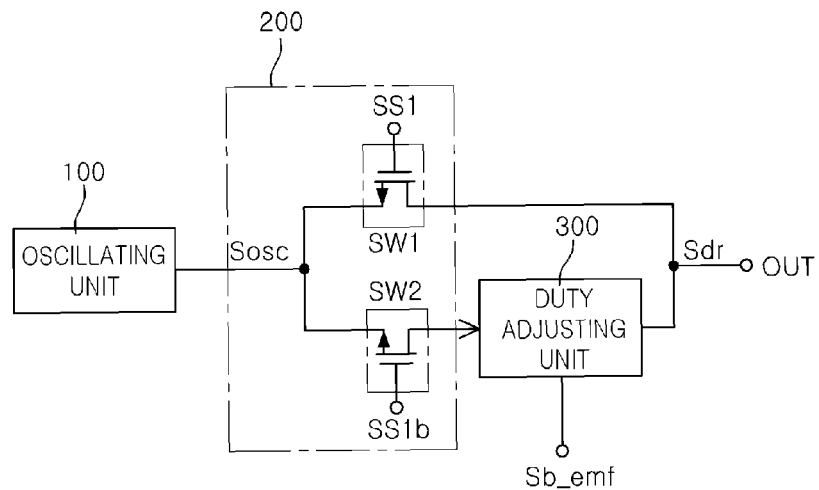
FIG. 1 is a block diagram of an apparatus for generating a motor driving control signal according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the same reference numerals will be used throughout to designate the same or like components.

FIG. 1 is a block diagram of an apparatus for generating a motor driving control signal according to an embodiment of the present invention.

Referring to FIG. 1, the apparatus for generating a motor driving control signal according to the embodiment of the present invention may include an oscillating unit 100, a selecting unit 200, and a duty adjusting unit 300.

Referring to FIG. 1, the oscillating unit 100 may generate an oscillating signal Sosc having a preset duty ratio. For example, the oscillating signal Sosc may be preset to have a duty ratio of 50%.

The duty ratio of the oscillating signal as described above may be set differently according to an environment of an applied system. In addition, the oscillating signal Sosc may be a square wave signal having a preset period.

The selecting unit 200 may include a first switch SW1 and a second switch SW2 that are complementarily operated with respect to each other.

The first switch SW1 may be installed on a first path PH1 connected between the oscillating unit 100 and an output terminal OUT to switch the first path PH1. For example, when the first switch SW1 is turned on, the first path PH1 may be connected, and when the first switch SW1 is turned off, the first path PH1 may be blocked.

In addition, the second switch SW2 may be complementarily operated with respect to the first switch SW1 to switch a second path PH2 connected to the first path PH1 in parallel. For example, when the second switch SW2 is turned on, the second path PH2 may be connected, and when the second switch SW2 is turned off, the second path PH2 may be blocked.

More specifically, the first switch SW1 may be turned on for a preset initial driving time (Ta) to connect the first path PH1.

The second switch SW2 may be turned off for the initial driving time (Ta) and turned on after the initial driving time (Ta) has elapsed to connect the second path PH2.

The duty adjusting unit 300 may be installed on the second path PH2 between the second switch SW2 and the output terminal OUT and adjusting a duty ratio of the oscillating signal Sosc according to a rotation speed signal Sb_emf of the motor, thereby outputting the signal having the adjusted duty ratio as a driving control signal Sdr through the output terminal OUT.

Here, the rotation speed signal Sb_emf of the motor may be a back electromotive force voltage generated during driving the motor.

Figure 2:
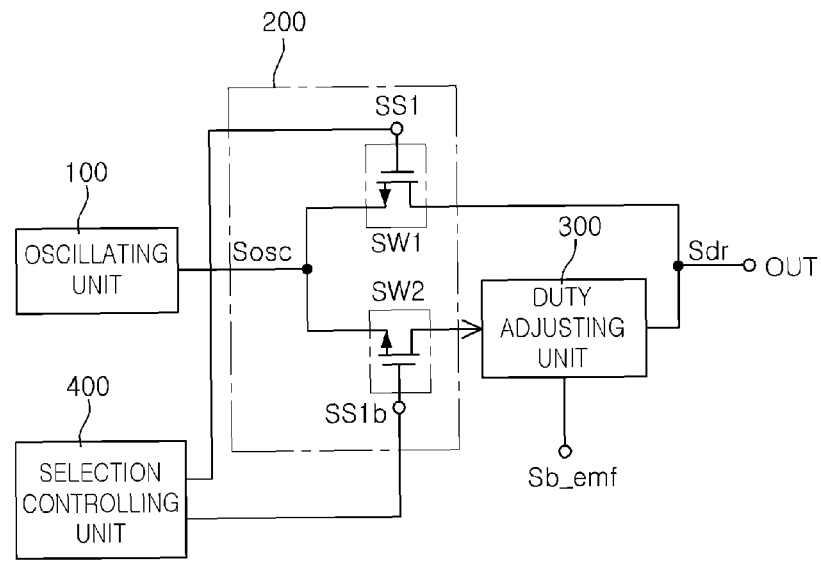
FIG. 2 is a block diagram of an apparatus for generating a motor driving control signal according to another embodiment of the present invention.

FIG. 2 is a block diagram of an apparatus for generating a motor driving control signal according to another embodiment of the present invention.

Referring to FIG. 2, the apparatus for generating a motor driving control signal according to another embodiment of the present invention may include an oscillating unit 100, a selecting unit 200, a duty adjusting unit 300, and a selection controlling unit 400.

That is, the apparatus for generating a motor driving control signal according to this embodiment of the present invention may further include the selection controlling unit 400, in addition to the components of the apparatus for generating a motor driving control signal according to the above-described embodiment of the present invention.

The oscillating unit 100 may generate an oscillating signal Sosc having a preset duty ratio. For example, the oscillating signal Sosc may be preset to have a duty ratio of 50%.

The duty ratio of the oscillating signal as described above may be set differently according to an environment of an applied system. In addition, the oscillating signal Sosc may be a square wave signal having a preset period.

The selecting unit 200 may include a first switch SW1 and a second switch SW2 that are complementarily operated with respect to each other and are operated according to a control of the selection controlling unit 400.

The first switch SW1 may be installed on a first path PH1 connected between the oscillating unit 100 and an output terminal OUT to switch the first path PH1 according to the control of the selection controlling unit 400. For example, when the first switch SW1 is turned on, the first path PH1 may be connected, and when the first switch SW1 is turned off, the first path PH1 may be blocked.

In addition, the second switch SW2 may be complementarily operated with respect to the first switch SW1 to switch a second path PH2 connected to the first path PH1 in parallel according to the control of the selection controlling unit 400. For example, when the second switch SW2 is turned on, the second path PH2 may be connected, and when the second switch SW2 is turned off, the second path PH2 may be blocked.

More specifically, the first switch SW1 may be turned on for a preset initial driving time (Ta) according to the control of the selection controlling unit 400 to connect the first path PH1.

The second switch SW2 may be turned off for the initial driving time (Ta) and turned on after the initial driving time (Ta) has elapsed according to the control of the selection controlling unit 400 to connect the second path PH2.

The duty adjusting unit 300 may be installed on the second path PH2 between the second switch SW2 and the output terminal OUT to adjust a duty ratio of the oscillating signal Sosc according to a rotation speed signal Sb_emf of the motor provided through the second switch SW2 in the case in which the second switch SW2 is turned on, thereby outputting the signal having the adjusted duty ratio as a driving control signal Sdr through the output terminal OUT.

Here, the rotation speed signal Sb_emf of the motor may be a back electromotive force voltage generated during driving the motor.

The selection controlling unit 400 may generate a first switching signal SS1 for controlling the first switch SW1 and a second switching signal SS1b for switching the second switch SW2.

Here, the first switching signal SS1 and the second switching signal SS1b may be complementarily operated with respect to each other. For example, the first switch SW1 may be turned on by the first switching signal SS1 in order to perform initial driving, and the second switch SW2 may be turned on by the second switching signal SS1b in order to perform normal driving after the initial driving.

Figure 3:
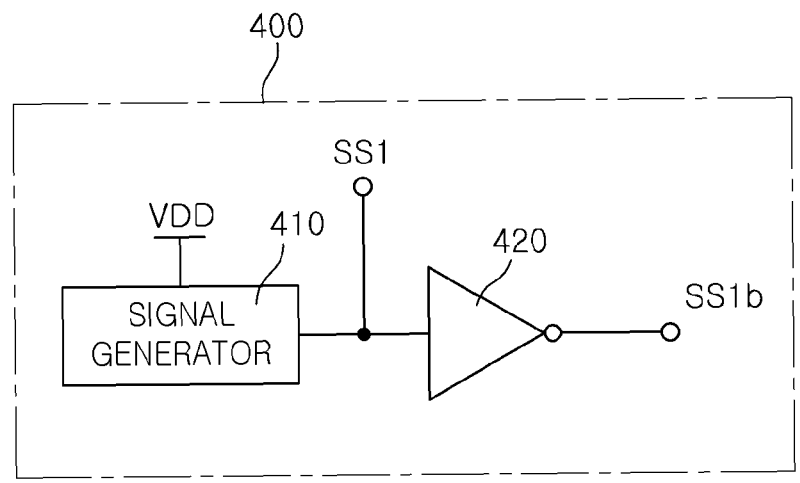
FIG. 3 is a configuration diagram of a selection controlling unit according to the embodiment of the present invention.

FIG. 3 is a configuration diagram of a selection controlling unit according to the embodiment of the present invention.

Referring to FIG. 3, the selection controlling unit 400 may include a signal generator 410 and an inverter 420.

The signal generator 410 may generate the first switching signal SS1 having a high level for the preset initial driving time Ta according to a power supply voltage Vdd supplied during power on.

The inverter 420 may invert the first switching signal SS1 to generate the second switching signal SS1b having a high level after the initial driving time Ta has elapsed.

Figure 4:
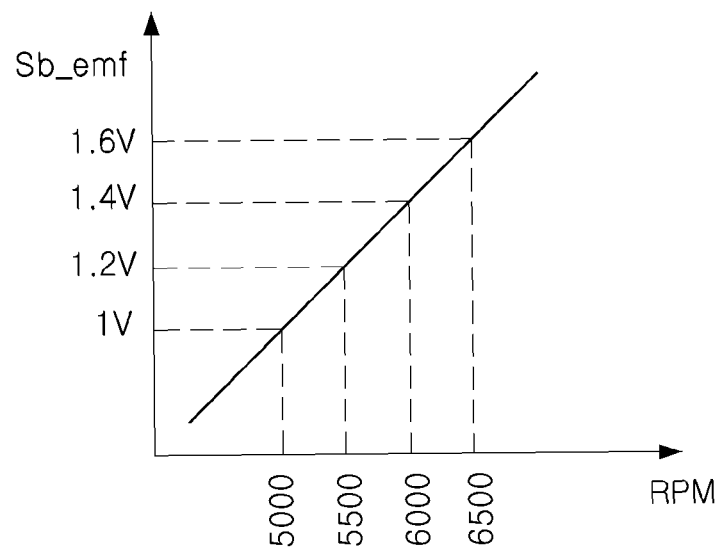
FIG. 4 is a graph showing a relationship between a back electromotive force voltage and a speed according to the embodiment of the present invention.

FIG. 4 is a graph showing a relationship between a back electromotive force voltage and a speed according to the embodiment of the present invention.

In the graph shown in FIG. 4, a vertical axis indicates a back electromotive force voltage (a rotation speed signal), and a horizontal axis indicates a rotation speed of the motor. It may be appreciated from the graph shown in FIG. 4 that the back electromotive force voltage is in proportion to the rotation speed of the motor.

Figure 5:
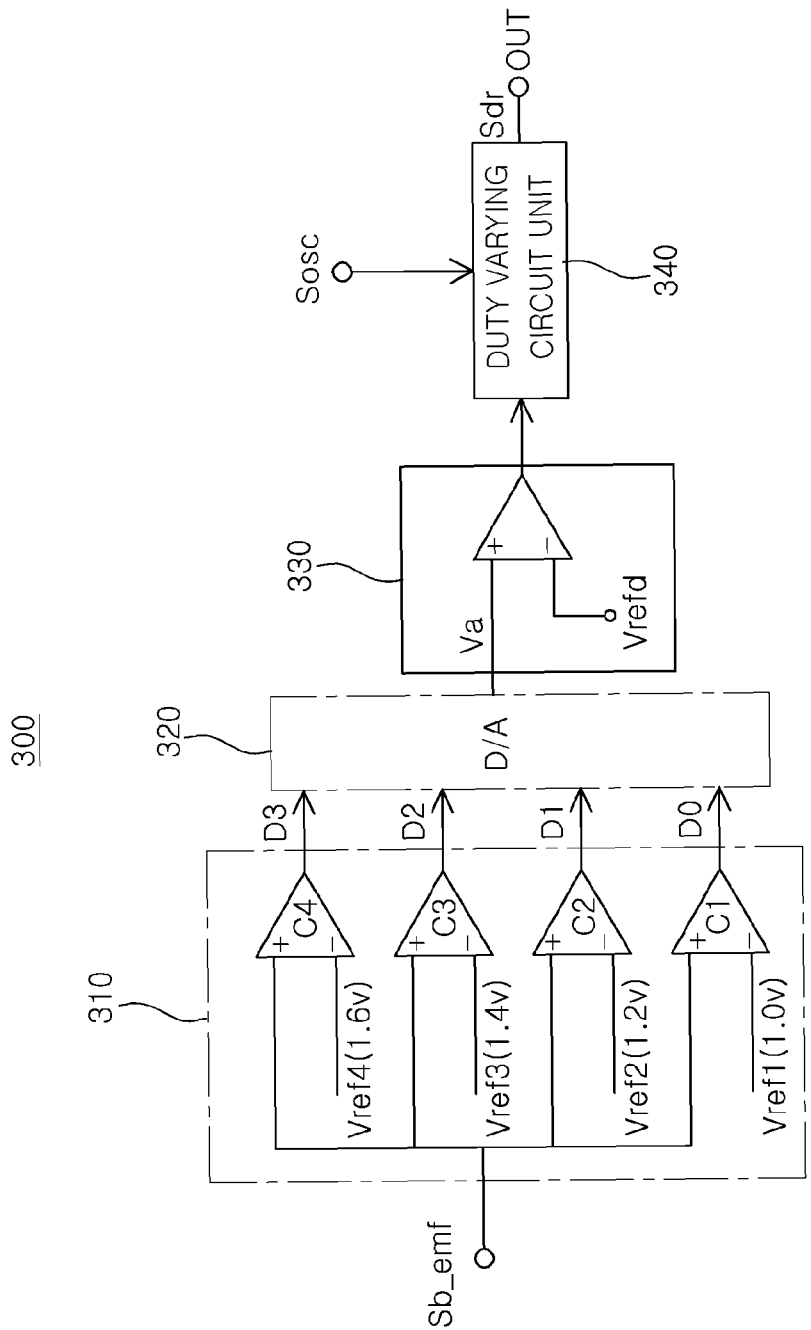
FIG. 5 is a configuration diagram of a duty adjusting unit according to the embodiment of the present invention.

FIG. 5 is a configuration diagram of a duty adjusting unit according to the embodiment of the present invention.

Referring to FIG. 5, the duty adjusting unit 300 may include a first comparing unit 310, a digital to analog converting unit 320, a second comparing unit 330, and a duty varying circuit unit 340.

The first comparing unit 310 may compare a plurality of reference voltages set to have different voltage levels with the rotation speed signal Sb_emf to generate a digital signal corresponding to a level of the rotation speed signal Sb_emf.

For example, the first comparing unit 310 may have four comparators, that is, first to fourth comparators C1 to C4, connected in parallel to each other. However, this is only an example, and the present invention is not limited thereto.

Here, the first to fourth comparators C1 to C4 may output digital signals D0 to D3. The first comparing unit 310 will be described on the assumption that the rotation speed signal Sb_emf is the back electromotive force voltage.

First, the first comparator C1 may compare a preset first reference voltage Vref1 with the back electromotive force voltage Sb_emf and output a logic "1" when the back electromotive force voltage Sb_emf is equal to or higher than the first reference voltage Vref1 and output a logic "0" when the back electromotive force voltage Sb_emf is lower than the first reference voltage Vref1.

The second comparator C2 may compare a preset second reference voltage Vref2 with the back electromotive force voltage Sb_emf and output a logic "1" when the back electromotive force voltage Sb_emf is equal to or higher than the second reference voltage Vref2 and output a logic "0" when the back electromotive force voltage Sb_emf is lower than the second reference voltage Vref2.

The third comparator C3 may compare a preset third reference voltage Vref3 with the back electromotive force voltage Sb_emf and output a logic "1" when the back electromotive force voltage Sb_emf is equal to or higher than the third reference voltage Vref3 and output a logic "0" when the back electromotive force voltage Sb_emf is lower than the third reference voltage Vref3.

In addition, the fourth comparator C4 may compare a preset fourth reference voltage Vref4 with the back electromotive force voltage Sb_emf and output a logic "1" when the back electromotive force voltage Sb_emf is equal to or higher than the fourth reference voltage Vref4 and output a logic "0" when the back electromotive force voltage Sb_emf is lower than the fourth reference voltage Vref4.

Here, the first reference voltage Vref1, the second reference voltage Vref2, the third reference voltage Vref3, and the fourth reference voltage Vref4 may be set to sequentially high voltages.

For example, in the case in which the first reference voltage Vref1 is set to 1.0V, the second reference voltage Vref2 is set to 1.2V, the third reference voltage Vref3 is set to 1.4V, and the fourth reference voltage Vref4 is set to 1.6V, when the back electromotive force voltage Sb_emf is 0V, the digital signals D3, D2, D1, and D0 may be '0000', when the back electromotive force voltage Sb_emf is 1.1V, the digital signals D3, D2, D1, and D0 may be '0001', when the back electromotive force voltage Sb_emf is 1.3V, the digital signals D3, D2, D1, and D0 may be '0011', when the back electromotive force voltage Sb_emf is 1.5V, the digital signals D3, D2, D1, and D0 may be '0111', and when the back electromotive force voltage Sb_emf is 1.7V, the digital signals D3, D2, D1, and D0 may be '1111'.

The digital to analog converting unit 320 may convert the digital signal into an analog voltage Va.

For example, when the digital signals D3, D2, D1, and D0 are '0000', the digital to analog converting unit 320 may convert these digital signals into 0V, when the digital signals D3, D2, D1, and D0 are '0001', the digital to analog converting unit 320 may convert these digital signals into 0.5V, when the digital signals D3, D2, D1, and D0 are '0011', the digital to analog converting unit 320 may convert these digital signals into 1V, when the digital signals D3, D2, D1, and D0 are '0111', the digital to analog converting unit 320 may convert these digital signals into 1.5V, and when the digital signals D3, D2, D1, and D0 are '1111', the digital to analog converting unit 320 may convert these digital signals into 2V.

The second comparing unit 330 may compare the analog voltage Va with a preset duty reference voltage Vrefd and provide a comparison result signal Scom.

For example, in the case in which the duty reference voltage is set to 1V, when the analog voltage Va is lower than 1V, the comparison result signal Scom may have a low level, and when the analog voltage Va is 1V or higher, the comparison result signal Scom may have a high level.

The duty varying circuit unit 340 may vary a width of the oscillating signal Sosc according to the comparison result signal Scom.

For example, the duty varying circuit unit 340 may decrease the width of the oscillating signal Sosc by a preset amount when the comparison result signal has a high level, and increase the width of the oscillating signal Sosc by a preset amount when the comparison result signal has a low level.

Here, in order to decrease or increase the width of the oscillating signal Sosc, the preset amount may be, for example, an amount corresponding to 2% of one period of the oscillating signal Sosc. However, the preset amount is not limited thereto, but may be changed according to a situation of an applied system.

Figure 6:
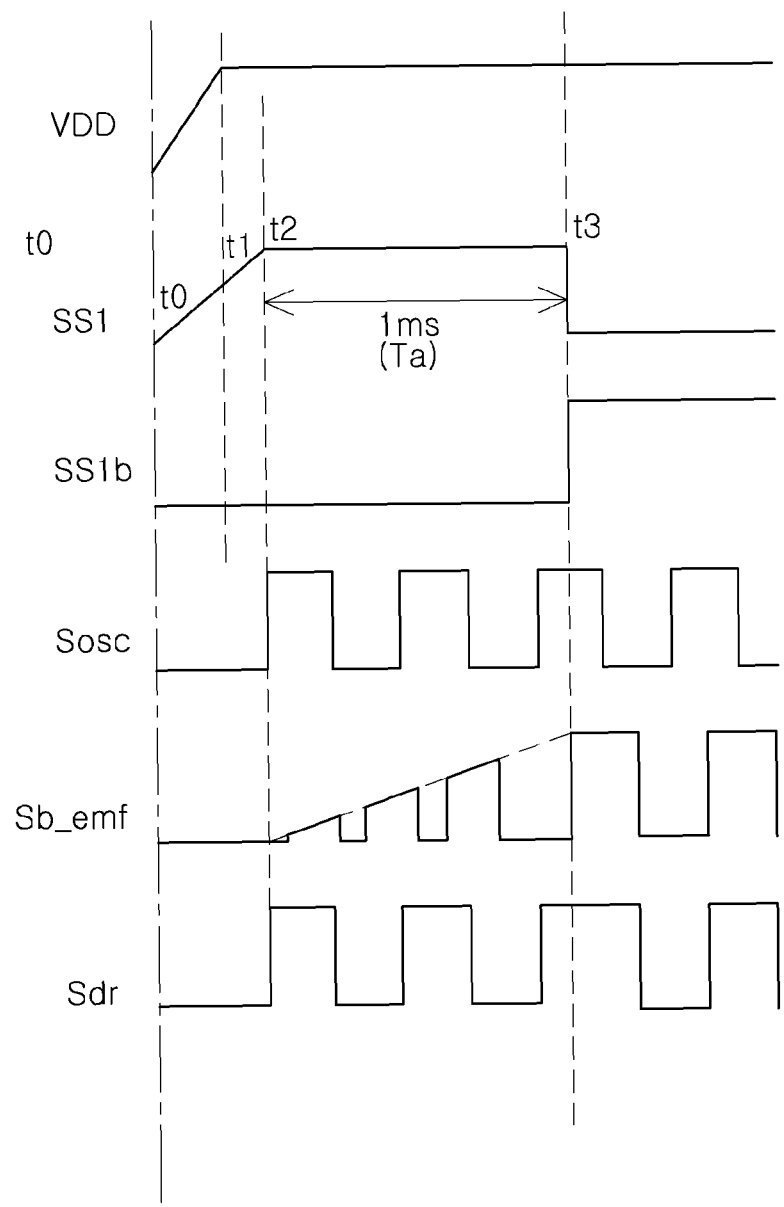
FIG. 6 is a timing chart of main signals according to the embodiment of the present invention.

FIG. 6 is a timing chart of main signals according to the embodiment of the present invention.

Referring to FIG. 6, Vdd indicates a power supply voltage; SS1 indicates a first switching signal; SS1b indicates a second switching signal; Sosc indicates an oscillating signal; Sb_emf indicates a back electromotive force voltage (motor speed signal); and Sdr indicates a driving control signal.

In FIG. 6, the power supply voltage Vdd rises from a point in time t0 to a point in time t1, and the first switching signal SS1 rises from the point in time t0 to a point in time t2, is maintained in a high level between the point in time t2 and a point in time t3 (Ta: initial driving time), and is changed into a low level at the point in time t3.

The second switching signal SS1b is maintained in a low level to the point in time t3, and is changed into a high level at the point in time t3 at which the first switching signal SS1 is changed into the low level.

During the initial driving time Ta, the oscillating signal Sosc is selected by the first switch SW1 and is output as the driving control signal Sdr.

After the initial driving time Ta has elapsed, a signal from the duty adjusting unit 300 is output as the driving control signal Sdr by the second switch SW2.

As described above, during the initial driving time Ta, the oscillating signal Sosc is provided as the driving control signal Sdr, and after the initial driving time Ta has elapsed, a width of the oscillating signal is varied and the oscillating signal having the varied width is provided as the driving control signal Sdr.

As set forth above, according to embodiments of the present invention, an initial driving period and a period after the initial driving period are separated from each other, and an oscillating signal is provided as a driving control signal in the initial driving period, while a driving control signal having a pulse width varied according to back electromotive force is provided in the period after the initial driving period. Therefore, since the oscillating signal may be provided as the driving control signal without being based on a back electromotive force voltage in the initial driving period, more stable initial driving may be ensured.

While the present invention has been shown and described in connection with the embodiments, it will be apparent to those skilled in the art that modifications and variations can be made without departing from the spirit and scope of the invention as defined by the appended claims.

What is claimed is:

1. An apparatus for generating a motor driving control signal, the apparatus comprising:
   an oscillating unit generating an oscillating signal having a preset duty ratio;
   a selecting unit including a first switch switching a first path connected between the oscillating unit and an output terminal and a second switch complementarily operated with respect to the first switch and switching a second path connected to the first path in parallel; and
   a duty adjusting unit installed on the second path between the second switch and the output terminal, adjusting a duty ratio of the oscillating signal according to a rotation speed signal of a motor, and outputting the signal having the adjusted duty ratio as a driving control signal through the output terminal.

2. The apparatus of claim 1, wherein the first switch is turned on for a preset initial driving time to connect the first path.

3. The apparatus of claim 2, wherein the second switch is turned off for the initial driving time and is turned on after the initial driving time has elapsed to connect the second path.

4. The apparatus of claim 2, wherein the oscillating signal is a square wave signal having a preset period.

5. The apparatus of claim 2, wherein the rotation speed signal of the motor is a back electromotive force voltage generated during driving the motor.

6. The apparatus of claim 2, wherein the duty adjusting unit includes:
   a first comparing unit comparing a plurality of reference voltages set to have different voltage levels with the rotation speed signal and outputting a digital signal corresponding to a level of the rotation speed signal;
   a digital to analog converting unit converting the digital signal into an analog voltage;
   a second comparing unit comparing the analog voltage with a preset duty reference voltage and providing a comparison result signal; and
   a duty varying circuit unit varying a width of the oscillating signal according to the comparison result signal.

7. The apparatus of claim 6, wherein the duty varying circuit unit decreases the width of the oscillating signal by a preset amount when the comparison result signal has a high level and increases the width of the oscillating signal by a preset amount when the comparison result signal has a low level.

8. An apparatus for generating a motor driving control signal, the apparatus comprising:
   an oscillating unit generating an oscillating signal having a preset duty ratio;
   a selecting unit including a first switch switching a first path connected between the oscillating unit and an output terminal and a second switch complementarily operated with respect to the first switch and switching a second path connected to the first path in parallel;
   a duty adjusting unit installed on the second path between the second switch and the output terminal, adjusting a duty ratio of the oscillating signal according to a rotation speed signal of a motor, and outputting the signal having the adjusted duty ratio as a driving control signal through the output terminal; and
   a selection controlling unit generating a first switching signal for controlling the first switch and a second switching signal for switching the second switch.

9. The apparatus of claim 8, wherein the selection controlling unit includes:
   a signal generator generating the first switching signal having a high level for a preset initial driving time according to a power supply voltage supplied during power on; and
   an inverter inverting the first switching signal to generate the second switching signal.

10. The apparatus of claim 8, wherein the first switch is turned on for a preset initial driving time to connect the first path.

11. The apparatus of claim 10, wherein the second switch is turned off for the initial driving time and is turned on after the initial driving time has elapsed to connect the second path.

12. The apparatus of claim 10, wherein the oscillating signal is a square wave signal having a preset period.

13. The apparatus of claim 10, wherein the rotation speed signal of the motor is a back electromotive force voltage generated during driving the motor.

14. The apparatus of claim 10, wherein the duty adjusting unit includes:
- a first comparing unit comparing a plurality of reference voltages set to have different voltage levels with the rotation speed signal and outputting a digital signal corresponding to a level of the rotation speed signal;
- a digital to analog converting unit converting the digital signal into an analog voltage;
- a second comparing unit comparing the analog voltage with a preset duty reference voltage and providing a comparison result signal; and
- a duty varying circuit unit varying a width of the oscillating signal according to the comparison result signal.

15. The apparatus of claim 14, wherein the duty varying circuit unit decreases the width of the oscillating signal by a preset amount when the comparison result signal has a high level, and increases the width of the oscillating signal by a preset amount when the comparison result signal has a low level.

\* \* \* \* \*